(12) United States Patent
Klapatch

(10) Patent No.: US 8,847,650 B1
(45) Date of Patent: Sep. 30, 2014

(54) GENERATING SIGNAL WAVEFORMS OF A PREDETERMINED FORMAT

(71) Applicant: Robert D. Klapatch, Wethersfield, CT (US)

(72) Inventor: Robert D. Klapatch, Wethersfield, CT (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 0 days.

(21) Appl. No.: 13/898,223

(22) Filed: May 20, 2013

(51) Int. Cl.
*H03H 11/26* (2006.01)
*H03K 5/06* (2006.01)

(52) U.S. Cl.
CPC ........................................ *H03K 5/06* (2013.01)
USPC ............ 327/261; 327/182; 327/268; 327/271

(58) Field of Classification Search
CPC ........ H03K 5/133; H03K 5/134; H03K 5/135
USPC .......................................... 327/182, 183, 261
See application file for complete search history.

(56) References Cited

U.S. PATENT DOCUMENTS 5,946,268 A * 8/1999 Iwamoto et al. ............ 365/233.1

OTHER PUBLICATIONS

Department of Defense Interface Standard, Aircraft/Store Electrical Interconnection System, MIL-STD-1760E, Oct. 24, 2007, 219 pages.

* cited by examiner

*Primary Examiner* — John Poos
(74) *Attorney, Agent, or Firm* — Edwards Wildman Palmer LLP; Scott D. Wofsy; Joshua L. Jones

(57) ABSTRACT

A method and apparatus for generating a wave shaped pulse electronic signal of a predetermined format from a square pulse signal generator. A signal is applied from the square pulse generator to circuitry having a plurality of transmission lines. Each transmission line having a certain length creating a certain signal time delay and signal reflection for a signal applied to the circuitry from the square pulse generator so as to create a delay pulse from each transmission line. Each delay pulse is combined from each transmission line to generate the wave shaped pulse electronic signal of a desired predetermined format.

10 Claims, 5 Drawing Sheets

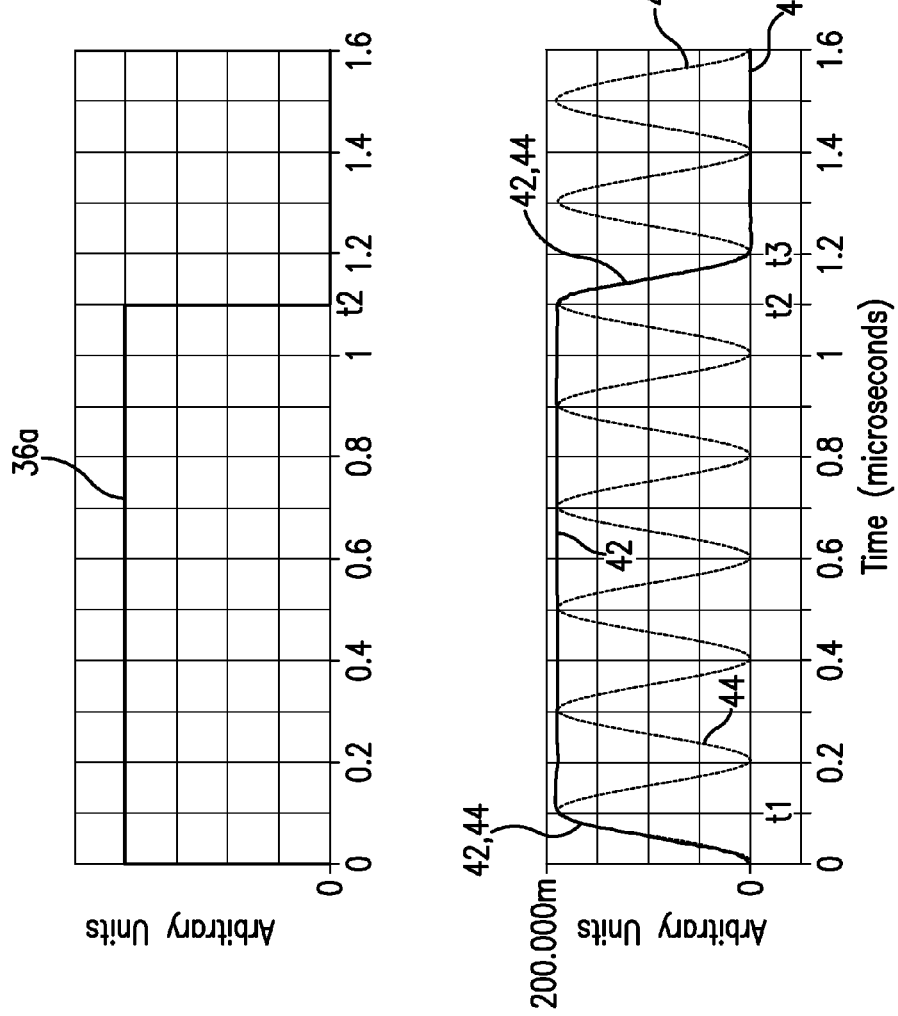

GENERATING SIGNAL WAVEFORMS OF A PREDETERMINED FORMAT

FIELD OF THE INVENTION

The invention relates to an method and apparatus for generating electric signal waveforms of a predetermined format, and more specifically, to using time delays from transmission lines to generate electric signal waveforms of a predetermined format.

BACKGROUND OF THE INVENTION

This section is intended to provide a background or context to the embodiments disclosed below. The description herein may include concepts that could be pursued, but are not necessarily ones that have been previously conceived, implemented or described. Therefore, unless otherwise explicitly indicated herein, what is described in this section is not prior art to the description in this application and is not admitted to be prior art by inclusion in this section.

It is to be appreciated conventional methods for creating custom high speed wave shape pulses have typically involved the use of a fast arbitrary waveform generator. A significant drawback associated therewith is such methods involve complex and expensive equipment while also being limited by the speed of their components, such as memory components and D/A (digital-to-analog) converters positioned within the waveform generator equipment.

It is thus desirable to overcome the aforementioned drawbacks be providing circuitry more efficiently sized and less costly for providing electric signal waveforms of a predetermined format.

SUMMARY OF THE INVENTION

The purpose and advantages of the invention will be set forth in and apparent from the description that follows. Additional advantages of the invention will be realized and attained by the devices, systems and methods particularly pointed out in the written description and claims hereof, as well as from the appended drawings.

To achieve these and other advantages and in accordance with the purpose of the invention, as embodied, the invention includes, in one aspect, a method and apparatus for generating a wave shaped pulse electronic signal of a predetermined format from preferably a square pulse signal generator. An aspect of the invention includes applying a signal from square pulse generator to circuitry having a plurality of transmission lines. Each transmission line having a certain length creating a certain signal time delay and signal reflection for a signal applied to the circuitry from the square pulse generator so as to create a delay pulse from each transmission line. Each delay pulse is combined from each transmission line to generate the wave shaped pulse electronic signal of a desired predetermined format.

In further, optional aspects, the foregoing method and apparatus includes transmission line sections, each having a certain length, arranged in series relative to one another and configured to create time delay signals of an input waveform signal contingent upon its length. Impedance components are preferably positioned in tapped off ends of transmission line sections wherein time delay signals of each transmission line section are combined via the impedance components to form an output waveform signal of a predefined form.

According to additional aspects, each of the impedance components includes a resistive component whereby the delay signals of the transmission line sections are restively combined preferably using trapezoidal summation techniques. Yet additional aspects of the invention include a low band filter for smoothing the shape of the generated output waveform signal of the predefined form.

BRIEF DESCRIPTION OF THE DRAWINGS

The accompanying drawings illustrate various non-limiting, illustrative, inventive aspects in accordance with the present disclosure:

FIG. 2B depicts a plot of results using a wave shaping circuit of FIG. 2A; and

DETAILED DESCRIPTION OF CERTAIN EMBODIMENTS

Figure 1A:
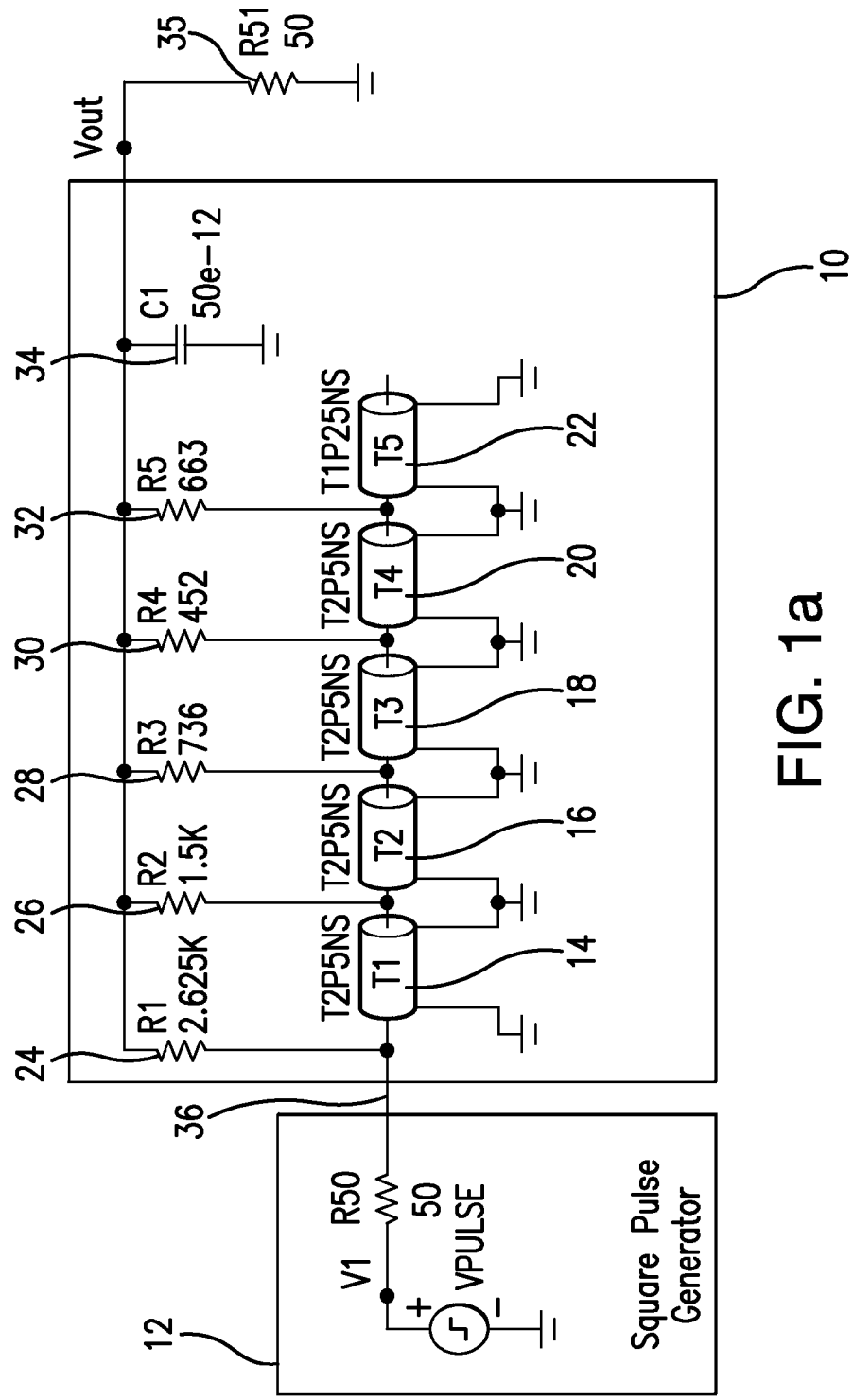
FIG. 1A depicts a diagram of a wave shaping circuit according to an illustrated embodiment.

The present invention is now described more fully with reference to the accompanying drawings, in which illustrated embodiments of the present invention are shown. The present invention is not limited in any way to the illustrated embodiments as the illustrated embodiments described below are merely exemplary of the invention, which can be embodied in various forms, as appreciated by one skilled in the art. Therefore, it is to be understood that any structural and functional details disclosed herein are not to be interpreted as limiting, but merely as a basis for the claims and as a representative for teaching one skilled in the art to variously employ the present invention. Furthermore, the terms and phrases used herein are not intended to be limiting but rather to provide an understandable description of the invention.

Where a range of values is provided, it is understood that each intervening value, to the tenth of the unit of the lower limit unless the context clearly dictates otherwise, between the upper and lower limit of that range and any other stated or intervening value in that stated range is encompassed within the invention. The upper and lower limits of these smaller ranges may independently be included in the smaller ranges is also encompassed within the invention, subject to any specifically excluded limit in the stated range. Where the stated range includes one or both of the limits, ranges excluding either both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, exemplary methods and materials are now described. Any publications mentioned herein are incorporated herein by reference to disclose and describe the methods and/or materials in connection with which the publications are cited.

It must be noted that as used herein and in the appended claims, the singular forms "a", "an," and "the" include plural referents unless the context clearly dictates otherwise. Thus, for example, reference to "a stimulus" includes a plurality of such stimuli and reference to "the signal" includes reference to one or more signals and equivalents thereof known to those skilled in the art, and so forth.

Turning now descriptively to the drawings, in which similar reference characters denote similar elements throughout the several views, a method and apparatus are presented for generating custom electric signal waveforms, such as raised cosine signals, preferably at high speeds, using multiple delay transmission line sections. For example, high speed wave shape pulses having a desired waveform shape/form are generated preferably using an input waveform signal from a standard square pulse generator, as to be described in various embodiments herein below.

For purposes of the present invention, it is to be appreciated and understood pulse widths are achievable in accordance with illustrated embodiments described herein in a nanosecond pulse width time range (e.g., 50 nanoseconds or shorter). According to a below illustrated embodiment, the present invention creates electric signal wave shaped pulses having a desired shape/form from preferably a square pulse generator source which produces an electric signal utilized to drive a series of preferably different length transmission line sections (each preferably having one or more resistors and capacitors tapped therein). Each transmission line creates a signal time delay and signal reflections at various points in time so as to create a delay pulse at a given time. The delay pulse duration is preferably determined by the length of the transmission line section. Each delay pulse from each transmission line section is preferably resistively combined to approximate the desired wave shape, via preferably a trapezoidal summation technique.

It is to be understood and appreciated that the accuracy of generating a desired wave shape is determined by the number of transmission line sections used to approximate the output wave shape. It is to be further understood a larger number of consecutive serial arranged transmission line sections typically correlates to more accurate approximation of achieving a desired wave shape.

In the below illustrated embodiments, certain transmission line sections are shown to have tapped off ends which preferably include impedance components (e.g., a component providing a certain signal impedance value such as a resistor or capacitor) such that time delay and reflected signals from each of the transmission lines sections are combined, via the aforesaid tapped ends, to form an output waveform signal of a predefined form. Moreover, a low band filter (e.g., consisting of a capacitor) may be used to filter the resulting output waveform signal from the aforesaid tapped ends of the transmission line sections to smooth a shape of the generated signal having the desired shape/form. It is also to be appreciated an open ended or shorted section of the one or more transmission line sections may also be used to create reflected pulses where desired.

As illustrated, a last transmission line section may be open ended (which corresponds to a total wave reflection) or terminated into a matched resistor to eliminate back wave reflections. It is to be understood each transmission line section may have a length common, or different, to one another (e.g., at least one of the transmission lines may have a length different than at least the other transmission lines). It is to be additionally understood a number of the transmission line sections may or may not be equal to a number of the impedances/resistors (or tapped lines) provided in the circuitry.

For purposes of understanding the certain illustrated embodiments described herein, and with regards to the aforementioned standard square pulse generator, the wave shaping circuitry of the invention may be embodied as a digital IC (integrated circuit) with buffers. Additionally, the waveform generator may be separate from a wave shaping circuit described herein or may be integrated (for example on a same IC) with the wave shaping circuit. Thus it is to be understood and appreciated that the certain illustrated embodiments described herein may be implemented on a circuit card such as integrated circuit by using resistors and a capacitor in combination with an artwork (such as embedded transmission line sections) built into the IC.

Accordingly, an advantageous feature of the present invention is its suitability for use in small, lightweight and low cost applications. For instance, one such application is for test verification of MIL-STD-1760E requirements, for which fast raised cosine test pulses may be generated using the embodiments described herein. As one skilled in the art recognizes, MIL-STD-1760 Aircraft/Store Electrical Interconnection System requirements define a standardized electrical interface between a military aircraft and its carriage stores.

With reference now to the drawings and the certain illustrated embodiments, and starting with FIG. 1A, shown is a diagram of a wave shaping circuit (WSC) 10 according to a first illustrated embodiment. In this embodiment, a raised cosine waveform is desired having a pulse duration of 50 ns. The WSC 10 is preferably driven by a simple square wave pulse source 12 which can be a separate component (as shown in FIG. 1A) or it may be combined with the WSC 10 for example on the same IC. In this embodiment, it is determined that each of the transmission lines sections 14, 16, 18 and 20 preferably has a time delay of 2.5 nanoseconds, and the last open ended transmission line section 22 has a time delay of 1.25 nanoseconds. It is further determined in this embodiment that resistors 24, 26, 28, 30 and 32 (which may be collectively known as impedance components for their imparted impedance values) in the tapped lines can have values, such as: 2,625; 1,500; 736; 452 and 663$\Omega$, respectively. It is to be appreciated WSC 10 preferably utilizes purely resistive components 24, 26, 28, 30 and 32, but in general they can be impedances comprising reactive components as well (capacitors and/or inductors). Additionally, WSC 10 further includes capacitor 34 determined to have a value of 50 picofarads and a load resistor 35 chosen to have 50$\Omega$ resistance.

It is to be understood that the optimal lengths of transmission line sections and resistor values (or generally impedance) for WSC 10 may be analytically calculated by deriving equations for WSC 10. It is noted simulators, such as the MicroCap10, can provide a method to vary circuit parameters in real time while simulating for result optimization.

Figure 1B:
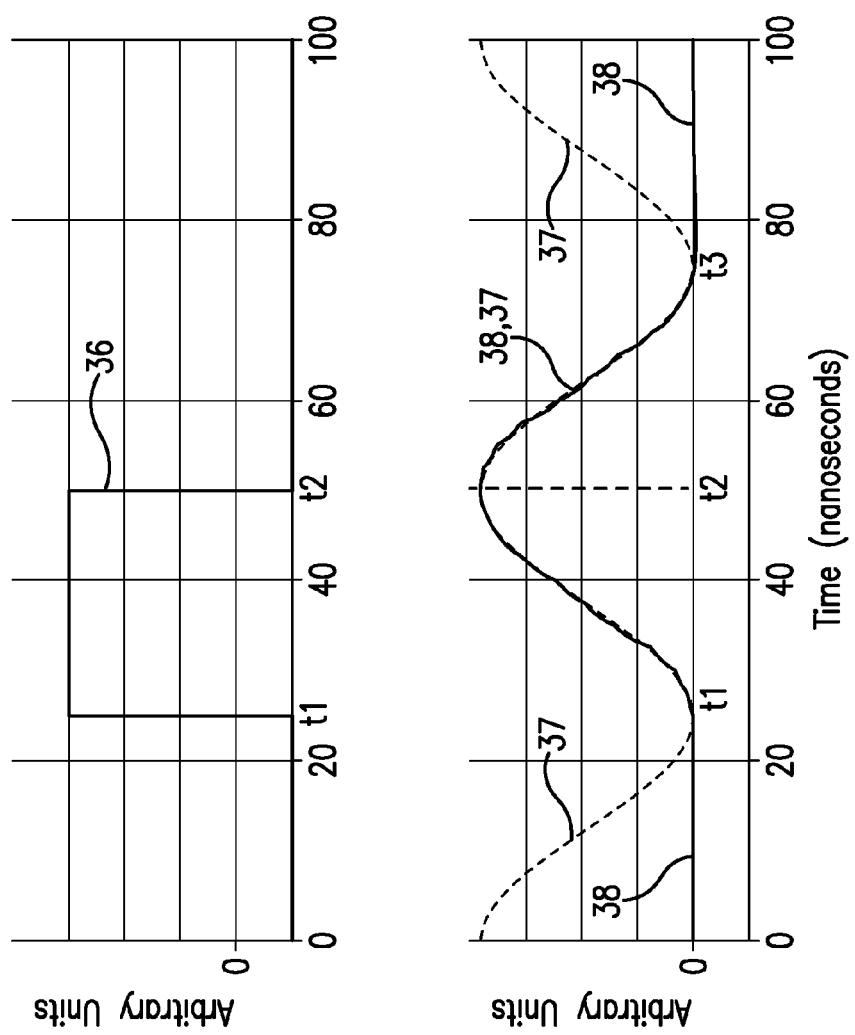
FIG. 1B depicts a plot of results using a wave shaping circuit of FIG. 1A.

With reference now to FIG. 1B, simulation results for the WSC 10 of FIG. 1A are shown. An input square pulse 36 (depicted as a function of time in nanoseconds) having a time duration t2–t1 is shown. A simulated output waveform signal 38 is also shown on the same time scale as the aforementioned input square pulse 36. As depicted, the output waveform signal 38 starts to increase from a zero value at the time t1 (beginning of the pulse 36) to a maximum value at the time t2 (end of the pulse 36). Then it decreases to the zero value at the time t3, where t2–t1 is approximately equal to t3–t2. Thus it is seen from FIG. 1B that output waveform signal 38 has a desired shape of a raised cosine function.

For comparison, a cosine waveform 37 is also depicted in FIG. 1B. Cosine waveform 37 is simulated as $A1(1+\sin(2\pi 20 \times 10^6 (T-37.4)))$, where T is a time in nanoseconds, and A1 is a scaling constant. As can be seen, the results indicate approximation between the desired raised cosine pulse waveform 38 with the simulated curve 37 in the overlap region between t1 and t3 (with a maximum at t2). It is to be appreciated that additional transmission line sections may be added if greater waveform fidelity is required.

Figure 2A:
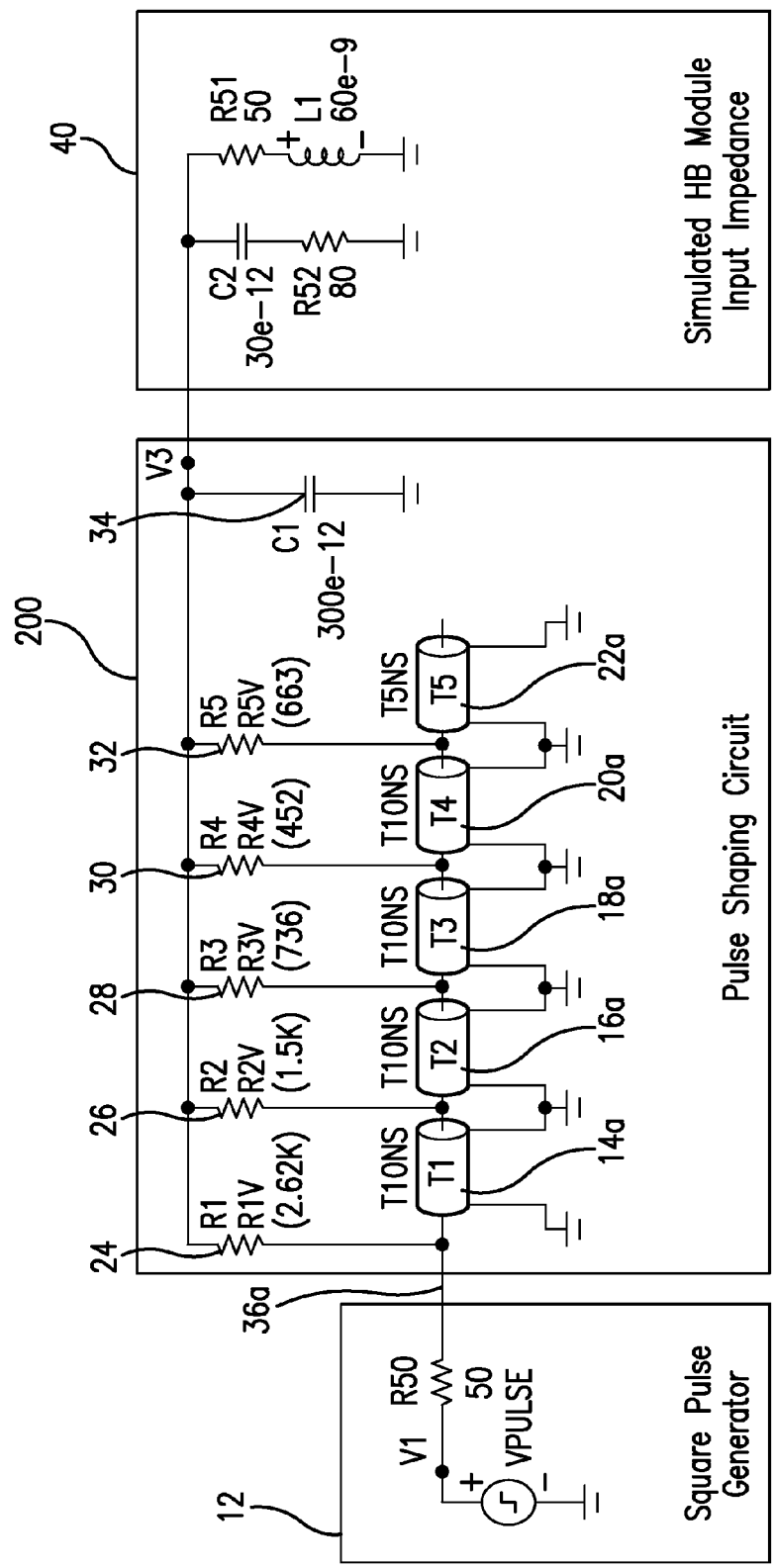
FIG. 2A depicts a diagram of a wave shaping circuit according to another illustrated embodiment.

With reference now to FIG. 2A, shown is a diagram of a wave shaping circuit referenced generally by numeral 200 according to another illustrated embodiment. In this illustrated embodiment, a variation of the raised cosine waveform is simulated. This variation preferably corresponds to high bandwidth systems. The desired waveform in this example is a pulse having a flat top and edges that follow a raised cosine waveform shape. It is to be understood this is a variation of the example presented in conjunction with FIGS. 1A and 1B.

With reference now to another illustrated embodiment, shown in FIG. 2A is WSC 200 driven by a simple square wave pulse source 12 (as was used with WSC 10 in FIG. 1B). The WSC 200 preferably includes capacitor 34a for providing low band filtering to smooth the output waveform signal $V_3$. In WSC 200, it is determined each of the transmission lines sections 14a, 16a, 18a and 20a preferably has a time delay of 10 nanoseconds, and the last open ended transmission lines section 22a preferably has a time delay of 5 nanoseconds. It is also determined that resistors 24a, 26a, 28a, 30a and 32a each preferably has a value of 2,625, 1,500, 736, 452 and 663Ω, respectively. Further, capacitor 34a preferably has a value of 300 picofarads. The output waveform signal $V_3$ is shown fed to a high bandwidth (HB) circuit 40 having a high input impedance (values of resistive and reactive components are indicated in FIG. 2A using Ohm, Farad and Henry units, respectively).

Results for the WSC 200 of FIG. 2A are shown in FIG. 2B. An input square pulse, referenced by numeral 36a (and as shown as a function of time in microseconds) having duration t2 is depicted. A stimulated output waveform signal, referenced by numeral 42, is also depicted in FIG. 2B having the same time scale as the input square pulse 36a. It is noted the output waveform signal 42 starts increasing from a zero value at zero time (beginning of the pulse 36a) to a maximum value at the time t1 and stays constant until the time t2 (end of the pulse 36a). Pulse 36a then decreases to the zero value at the time t3. It is seen from FIG. 2B that the signal 42 has a desired shape of the variation of the raised cosine function.

For comparison, a cosine waveform 44 is also shown in FIG. 2B. The cosine waveform 44 is simulated as $A1(1+\sin(2\pi 5 \times 10^6 (T-54)))$, where T is a time in nanoseconds and A1 is a scaling constant. As can be seen FIG. 2B, the results indicate approximation between the desired variation of the raised cosine pulse waveform 42 with the simulated cosine waveform 44 in the overlap regions between zero and t1, and between t2 and t3. Note, that additional transmission line sections may be added if greater waveform fidelity is required.

Figure 3:
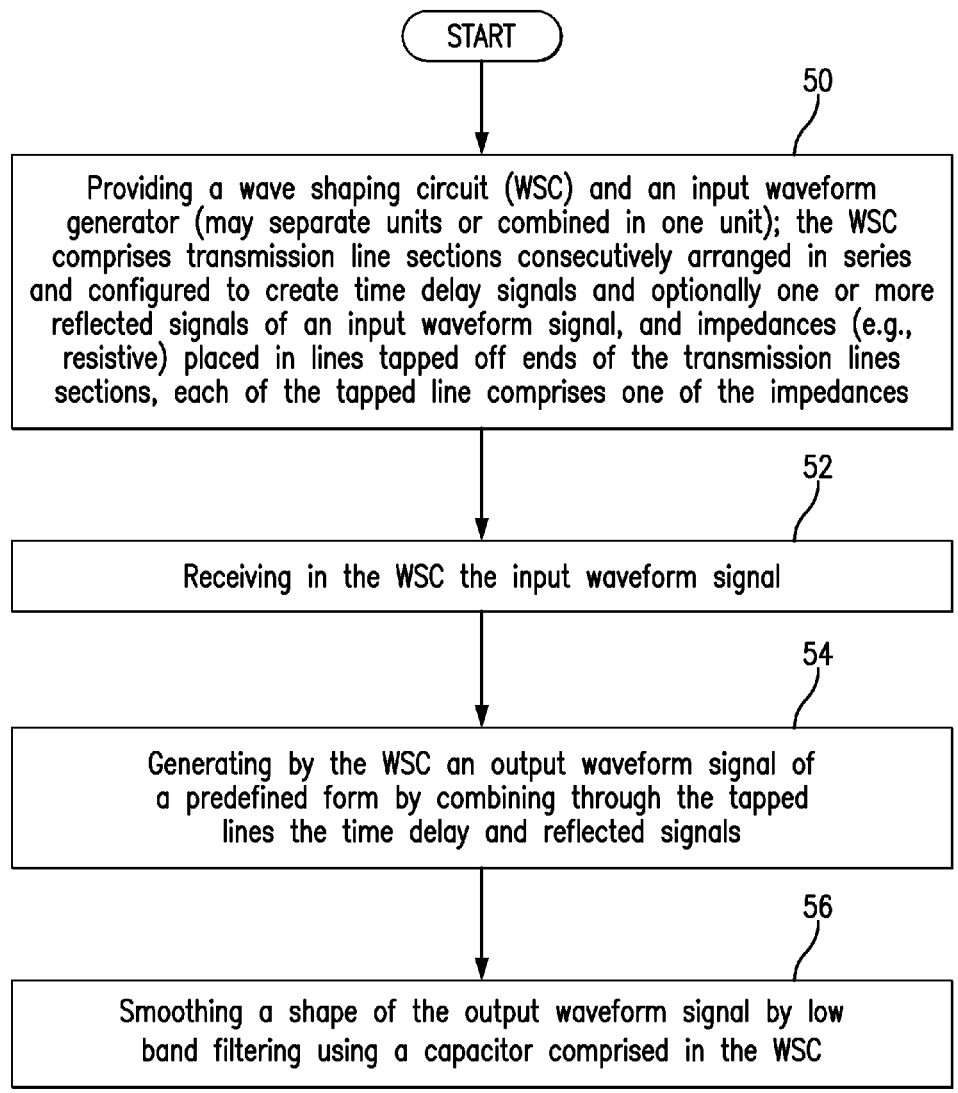
FIG. 3 depicts a flow chart illustrating implementation of various embodiments.

With reference now to FIG. 3, shown is a flow chart demonstrating implementation of the various illustrated embodiments. It is noted that the order of steps shown in FIG. 3 is not required, so in principle, the various steps may be performed out of the illustrated order. Also certain steps may be skipped, different steps may be added or substituted, or selected steps or groups of steps may be performed in a separate application following the embodiments described herein.

In a method according to the embodiment shown in FIG. 3, in a first step 50, a wave shaping circuit (WSC) and an input waveform generator are provided (which may be separate units or combined into one unit, such as an IC). The WSC (e.g., 10, 200) preferably includes transmission line sections consecutively arranged in series and configured to create time delay signals. Optionally, one or more reflected signals of the input waveform signal, and impedance elements (e.g., resistive), are positioned in tapped off ends of the transmission lines sections as described herein.

In a next step 52, the WSC receives an input waveform signal, such as a short pulse signal. In a next step 54, the WSC generates an output waveform signal of a predefined form by combining, and using the aforesaid tapped off ends of the transmission lines, the time delay and reflected signals. In a next step 56, a shape of the output waveform signal is preferably smoothed by low band filtering, preferably using a capacitor provided in the WSC.

Accordingly, what has been described above is a novel method, system and apparatus for generating an electric wave signal having a desired shape/form. Advantageous of the certain embodiments described herein include (but are not to be understood to be limited to) providing circuitry adapted and configured to generate desired electric wave shapes/forms similar to that of complex and costly circuitry typically requiring high speed memory that sequentially outputs successive data values, also typically followed by a D/A converter, to create a desired output waveform. It is noted that various non-limiting embodiments described herein may be used separately, combined or selectively combined for specific applications.

Further, some of the various features of the above non-limiting embodiments may be used to advantage without the corresponding use of other described features. The foregoing description should therefore be considered as merely illustrative of the principles, teachings and exemplary embodiments of this invention, and not in limitation thereof.

It is to be understood that the above-described arrangements are only illustrative of the application of the principles of the present invention. Numerous modifications and alternative arrangements may be devised by those skilled in the art without departing from the scope of the invention, and the appended claims are intended to cover such modifications and arrangements.

What is claimed is:

1. An apparatus, comprising:
   transmission line sections arranged in series and configured to create time delay signals of an input waveform signal; and
   impedance components, positioned in lines tapped off certain ends of the transmission line sections whereby the time delay signals of each transmission line section are combined via the impedance components to form an output waveform signal of a predefined form, wherein the transmission line sections are further configured to create one or more reflected signals such that both the time delay signals and the one or more reflected signals are combined to form the output waveform signal of the predefined form.

2. An apparatus, comprising:
   transmission line sections arranged in series and configured to create time delay signals of an input waveform signal; and
   impedance components, positioned in lines tapped off certain ends of the transmission line sections whereby the time delay signals of each transmission line section are combined via the impedance components to form an output waveform signal of a predefined form, wherein at least one of the transmission line sections has a length different than at least one other of the transmission line sections.

3. An apparatus, comprising:
   transmission line sections arranged in series and configured to create time delay signals of an input waveform signal; and impedance components, positioned in lines tapped off certain ends of the transmission line sections whereby the time delay signals of each transmission line section are combined via the impedance components to form an output waveform signal of a predefined form, wherein the time delay signals of each transmission line section is resistively combined to approximate the waveform signal of a predefined form using trapezoidal summation.

4. A method, comprising:
receiving in an apparatus an input waveform signal;
creating time delay signals of the input waveform signal using transmission line sections arranged in series; and
generating an output waveform signal of a predefined form by combining the time delay signals from the transmission line sections, wherein each of the transmission line sections are configured to create one or more reflected signals wherein both the time delay signals and the one or more reflected signals are combined to form the output waveform signal of the predefined form.

5. A method, comprising:
receiving in an apparatus an input waveform signal;
creating time delay signals of the input waveform signal using transmission line sections arranged in series; and
generating an output waveform signal of a predefined form by combining the time delay signals from the transmission line sections, wherein each of the transmission line sections includes a tapped end having an impedance component, wherein the output waveform signal of the predefined form is provided based on optimization of one or more of the lengths of the transmission line sections and values of the impedance components.

6. A method, comprising:
receiving in an apparatus an input waveform signal;
creating time delay signals of the input waveform signal using transmission line sections arranged in series; and
generating an output waveform signal of a predefined form by combining the time delay signals from the transmission line sections, wherein each of the transmission line sections includes a tapped end having an impedance component, further including using trapezoidal summation via the tapped lines of the transmission lines sections to form the output waveform signal of the predefined form.

7. A method for generating a wave shaped pulse of a predetermined format, the method comprising:
applying a pulse signal to circuitry having a plurality of transmission lines, each transmission line having a certain length creating a certain signal time delay and signal reflection for the pulsed signal applied to the circuitry so as to create a resulting delay pulse from each transmission line; and
combining each delay pulse from each transmission line to generate the wave shaped pulse of the predetermined format.

8. The method as recited in claim 7 further including using trapezoidal summation to combine each delay pulse.

9. The method as recited in claim 7 wherein at least one of the transmission lines has a length different than the other transmission lines.

10. The method as recited in claim 7 wherein the delay pulse from each of the transmission lines are resistively combined.

\* \* \* \* \*